United States Patent
Koh et al.

(10) Patent No.: US 7,202,180 B2
(45) Date of Patent: Apr. 10, 2007

(54) METHODS OF FORMING SEMICONDUCTOR DEVICES USING AN ETCH STOP LAYER

(75) Inventors: Kwang-Ok Koh, Gyeonggi-do (KR); Kun-Ho Kwak, Gyeonggi-do (KR); Byung-Jun Hwang, Gyeonggi-do (KR); Han-Soo Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 10/625,452

(22) Filed: Jul. 23, 2003

(65) Prior Publication Data

US 2004/0121612 A1 Jun. 24, 2004

(30) Foreign Application Priority Data

Oct. 29, 2002 (KR) .................. 10-2002-0066087

(51) Int. Cl.
*H01L 21/302* (2006.01)
(52) U.S. Cl. ............... 438/740; 438/231; 438/706; 438/714
(58) Field of Classification Search ............... 438/202, 438/216, 217, 230, 231, 706, 710, 723, 724, 438/740
See application file for complete search history.

(56) References Cited

U.S. PATENT DOCUMENTS

| 6,153,455 A | * | 11/2000 | Ling et al. | ................ 438/231 |
| 6,207,987 B1 | * | 3/2001 | Tottori | ................ 257/306 |
| 6,451,704 B1 | * | 9/2002 | Pradeep et al. | ............. 438/719 |

FOREIGN PATENT DOCUMENTS

JP 2001-244457 9/2001

OTHER PUBLICATIONS

Notice to File Response to a Rejection dated Jun. 21, 2004 issued by the Korean Intellectual Property Office for Korean Application No. 2002-66087.

* cited by examiner

*Primary Examiner*—Lan Vinh
(74) *Attorney, Agent, or Firm*—Myers Bigel Sibley & Sajovec, PA

(57) ABSTRACT

Methods of forming a semiconductor device are provided by forming a gate pattern that includes a gate electrode on a substrate. Lightly doped impurity diffusion layers are formed in the substrate at both sides of the gate pattern. Spacers are formed on sidewalls of the gate pattern. The spacers having a bottom width. Impurity ions are implanted using the gate pattern and the spacer as a mask to form a heavily doped impurity diffusion layer in the substrate. The spacers are removed. A conformal etch stop layer is formed on the gate pattern and the substrate. The etch stop layer is formed to a thickness of at least the bottom width of the spacers.

21 Claims, 11 Drawing Sheets

METHODS OF FORMING SEMICONDUCTOR DEVICES USING AN ETCH STOP LAYER

RELATED APPLICATION AND CLAIM OF PRIORITY

The present application is related to and claims priority from Korean Patent Application Serial No. 2002-66087 filed Oct. 29, 2002, the disclosure of which is incorporated herein by reference as if set forth fully herein.

FIELD OF THE INVENTION

The present invention generally relates to methods of forming semiconductor devices.

BACKGROUND OF THE INVENTION

Metal-oxide Semiconductor (MOS) transistors of semiconductor memory devices typically include a gate pattern formed on a substrate and source/drain regions formed in the substrate at opposite sides of the gate pattern. Generally, the source/drain regions are in a lightly doped structure that suppresses hot carrier effects and may provide for a high level of integration of the circuit. Conventionally, the source/drain regions are electrically connected to an upper conductive layer that fills a contact hole formed in an interlayer insulation layer.

As semiconductor devices become more highly integrated within a circuit, the area of the source/drain regions and the contact hole may become reduced. Thus, self-aligned contact hole technologies and borderless contact technologies have been proposed.

FIGS. 1 and 2 are cross-sectional views showing a method of forming a conventional semiconductor device.

Referring to FIG. 1, a device isolation layer (not shown) is formed in a substrate 1 to define an active region and then gate patterns 5 are formed to cross over the active regions in parallel. The gate pattern 5 includes a gate insulation layer 2, a gate electrode 3, and a hard mask layer 4 that are sequentially stacked. Conventionally, the gate insulation layer 2 is formed of thermal oxide and the gate electrode 3 is formed of a double-layered structure of polysilicon and tungsten silicide that are sequentially stacked. The hard mask layer 4 is formed of silicon nitride.

Using the gate pattern 5 as a mask, impurity ions are implanted to form lightly doped impurity diffusion layers 7a in the active region at both sides of the gate pattern 5. Spacers 8 are formed on both sidewalls of the gate pattern 5. The spacers 8 are formed of silicon nitride. Using the gate pattern 5 and the spacers 8 as a mask, impurity ions are implanted into the active region to form a heavily doped impurity diffusion layer 7b. The lightly and heavily doped impurity diffusion layers 7a and 7b form a lightly doped drain structure (LDD structure).

A conformal etch stop layer 9 is formed on a surface of the substrate 1 with the heavily doped impurity diffusion layer 7b. An interlayer insulation layer 10 is formed on the etch stop layer 9 to fill a gap region between the gate patterns 5. The etch stop layer 9 is formed of silicon nitride and the interlayer insulation layer 10 is formed of silicon oxide. The etch stop layer 9 may be provided to form a borderless contact hole (not shown) that exposes the active region and the device isolation layer. That is, the device isolation layer exposed during formation of the borderless contact hole is protected by the etch stop layer 9. In this case, the bottom width of the gap region between the gate patterns 5 is decreased by the etch stop layer 9. As a result, a void C may occur in the gap region while the interlayer insulation layer 10 is formed.

Referring to FIG. 2, a photoresist pattern (not shown) is formed on the interlayer insulation layer 10 to define a contact hole 11. Then, using the photoresist pattern as a mask, the interlayer insulation layer 10 is etched to expose the etch stop layer 9. The exposed etch stop layer 9 is located on the heavily doped impurity diffusion layer 7b and the spacers 8. The exposed etch stop layer 9 is removed to form the contact hole 11 that exposes the heavily doped impurity diffusion layer 7b. The contact hole 11 is a self-aligned contact hole that aligns itself to the hard mask layer 4 and the spacers 8. In addition, the contact hole 11 is a borderless contact hole that exposes a predetermined region of the device isolation layer (not shown). A conductive pattern 12 is formed to fill the contact hole 11.

According to the prior art discussed above, the etch stop layer 9 and the spacer 8 are formed of identical insulation material. Thus, when the exposed etch stop layer 9 is removed so as to form the contact hole 11, over etching and curved sidewalls of the spacers 8 may cause reduction of a bottom width of the spacers 8. As a result, the lightly doped impurity diffusion layers 7a may be exposed at regions d thereof.

As is further illustrated in FIGS. 1 and 2, each of the lightly doped impurity diffusion layers 7a is thinner than the heavily doped impurity diffusion layer 7b in junction depth. Therefore, when power is supplied to the conductive pattern 12, leakage current may flow through the exposed regions d of the lightly doped impurity diffusion layers into the substrate 1. That is, a leakage current characteristic of a device may be degraded. In the case where the exposed regions d of the lightly doped impurity diffusion layers are over etched and suffer from etching damage, the leakage current characteristic may be further deteriorated.

The leakage current characteristic may be further degraded if the contact hole 11 is formed as a butting contact hole (not shown). The butting contact hole exposes a portion of a gate electrode in the gate pattern and an impurity diffusion layer. In this case, the hard mask layer 3 in the gate pattern 5 is also etched, such that the spacer 8 may be further over etched. Thus, the above leakage current problems may be exacerbated.

SUMMARY OF THE INVENTION

Embodiments of the present invention provide methods of forming a semiconductor device by forming a gate pattern that includes a gate electrode on a substrate. Lightly doped impurity diffusion layers are formed in the substrate at both sides of the gate pattern. Spacers are formed on sidewalls of the gate pattern. The spacers having a bottom width. Impurity ions are implanted using the gate pattern and the spacer as a mask to form a heavily doped impurity diffusion layer in the substrate. The spacers are removed. A conformal etch stop layer is formed on the gate pattern and the substrate. The etch stop layer is formed to a thickness of at least the bottom width of the spacers.

In further embodiments of the present invention, a conformal etch shield layer is formed on the gate pattern and the substrate. The etch shield layer is formed of insulation material having etch selectivity with respect to the spacers. In such embodiments, the spacers are formed on the etch shield layer on opposite sidewalls of the gate pattern. Furthermore, a conformal buffer insulation layer may be formed on the gate pattern and the substrate. The conformal etch shield layer may be formed on the conformal buffer insulation layer.

In particular embodiments of the present invention, the spacers comprise silicon oxide and the etch shield layer comprise silicon nitride.

In further embodiments of the present invention, the heavily doped impurity diffusion layer has a higher impurity concentration than the lightly doped impurity diffusion layer. Also, the lightly and heavily doped impurity diffusion layers are formed to provide a lightly doped drain structure.

In additional embodiments of the present invention, the etch stop layer is formed to a thickness substantially identical to the bottom width of the spacer. Also, an interlayer insulation layer may be formed on the etch stop layer. The interlayer insulation layer and the etch stop layer may be successively patterned to form a contact hole that exposes at least the heavily doped impurity diffusion layer. A conductive pattern may be formed that fills the contact hole. In such embodiments, the etch stop layer may be formed of insulation material having etch selectivity with respect to the interlayer insulation layer. For example, the interlayer insulation layer may comprise silicon oxide, and the etch stop layer may comprise silicon nitride.

Successively patterning the interlayer insulation layer and the etch stop layer may be provided by patterning the interlayer insulation layer to expose at least the etch stop layer on the heavily doped impurity diffusion layer and anisotropically etching the exposed etch stop layer to form a contact hole that exposes at least the heavily doped impurity diffusion layer. In further embodiments, the contact hole further exposes a portion of the gate electrode in the gate pattern.

In yet other embodiments of the present invention, a semiconductor device is formed by forming a device isolation layer in a substrate to define first and second active regions. A first gate pattern is formed on the first active region and a second gate pattern is formed on the second active region. The first gate pattern includes a first gate insulation layer, a first gate electrode, and a first hard mask layer that are stacked, and the second gate pattern includes a second gate insulation layer, a second gate electrode, and a second hard mask layer that are stacked. A lightly doped impurity diffusion layer is formed in the first active region at both sides of the first gate pattern. Spacers are formed on sidewalls of the first and second gate patterns. The sidewall spacers having a bottom width. A heavily doped impurity diffusion layer is formed in the first active region using the first gate pattern and the spacers on the sidewalls of the first gate pattern as a mask. The spacers are removed and a conformal etch stop layer is formed on the first and second gate patterns and the substrate. The second gate pattern is formed to cross over the device isolation layer and to a device in the second active region. The etch stop layer is formed to a thickness of at least the bottom width of the sidewall spacers.

In further embodiments of the present invention, a conformal etch shield layer is formed on the first and second gate patterns and the substrate. The etch shield layer is formed of insulation material having etch selectivity with respect to the spacers. The spacers are formed on the etch shield layer on opposite sidewalls of the first and second gate patterns. Furthermore, a conformal buffer insulation layer may be formed on the first and second gate patterns and the substrate and the conformal etch shield layer formed on the buffer insulation layer. The spacers may comprise silicon oxide, and the etch shield layer may comprise silicon nitride.

In additional embodiments of the present invention, the heavily doped impurity diffusion layer has a higher impurity concentration than the lightly doped impurity diffusion layer. The lightly and heavily doped impurity diffusion layers are formed to provide a lightly doped drain structure.

In particular embodiments of the present invention, the etch stop layer is formed to a thickness substantially identical to the bottom width of the spacers.

In still further embodiments of the present invention, an interlayer insulation layer is formed on the etch stop layer. The interlayer insulation layer and the etch stop layer are successively patterned to form a contact hole that exposes the heavily doped impurity diffusion layer and a portion of the second gate electrode. A conductive pattern is formed to fill the contact hole. The etch stop layer may comprise an insulation material having etch selectivity with respect to the interlayer insulation layer. For example, the interlayer insulation layer may comprise silicon oxide, and the etch stop layer may comprise silicon nitride Furthermore, successively patterning the interlayer insulation layer and the etch stop layer may be provided by patterning the interlayer insulation layer to expose a portion of the etch stop layer that is located on the heavily and lightly doped impurity diffusion layers and a predetermined region of a top surface of the second gate pattern and successively etching the exposed etch stop layer and the second hard mask layer to form a contact hole that exposes the heavily doped impurity diffusion layer and a portion of the second gate electrode.

DETAILED DESCRIPTION OF THE EXEMPLARY EMBODIMENT

Figure 1:
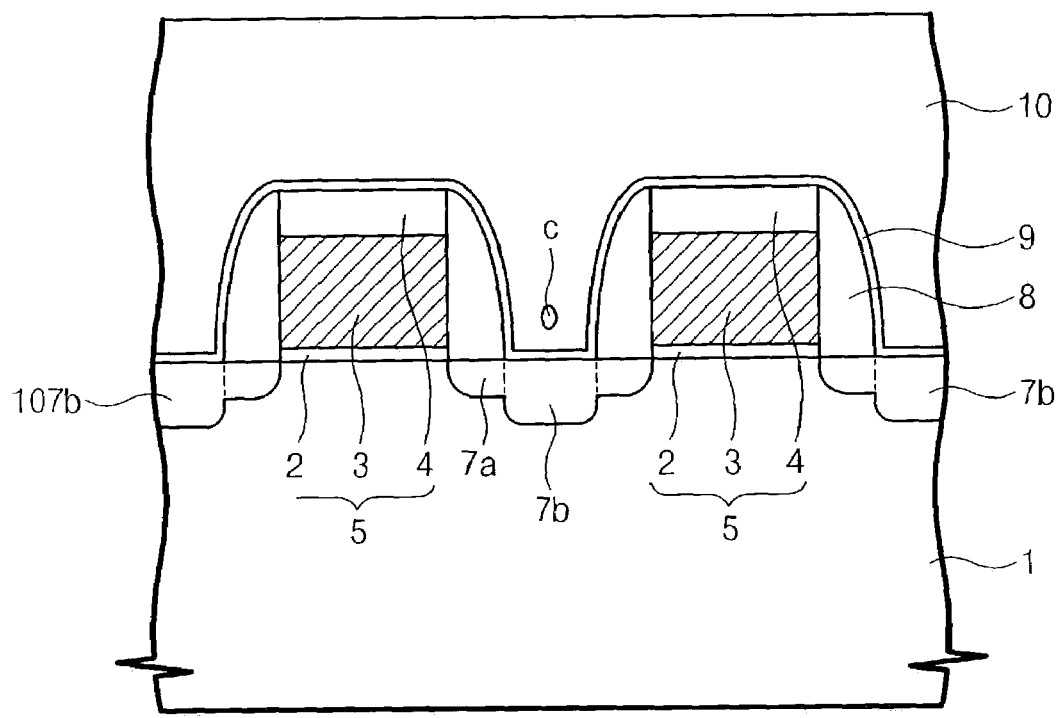
FIGS. 1 and 2 are cross-sectional views showing a method of forming a conventional semiconductor device.
Figure 2:
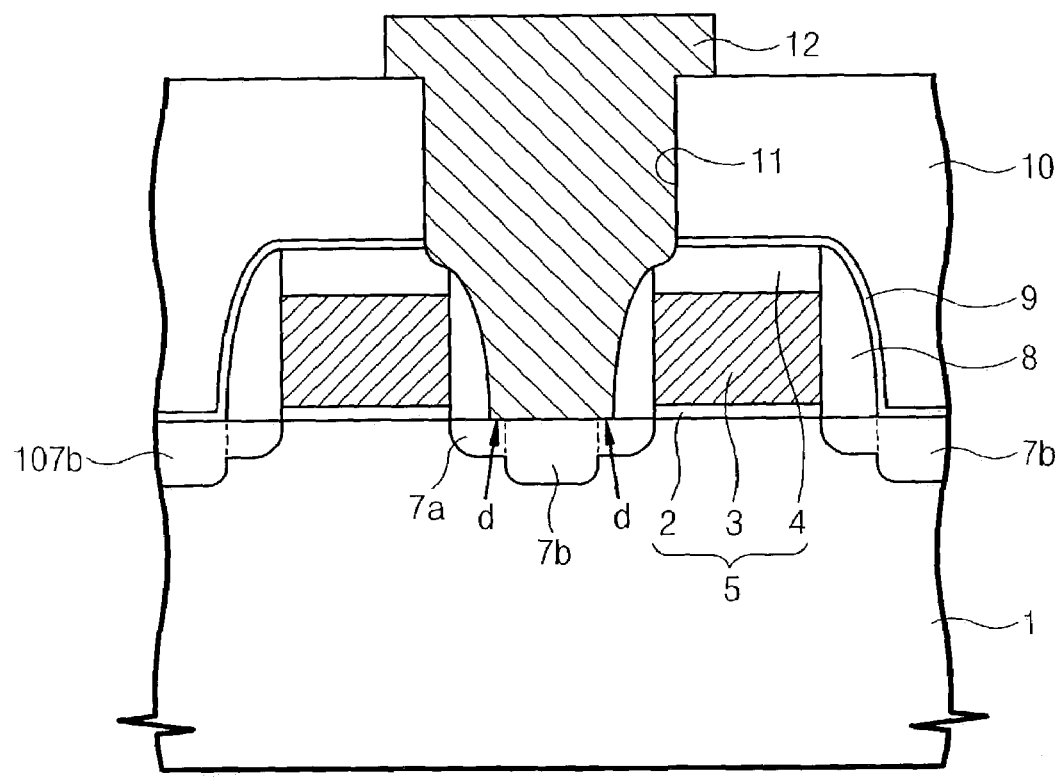

The present invention will be described more fully hereinafter with reference to the accompanying drawings, in which preferred embodiments of the invention are shown. This invention, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 3:
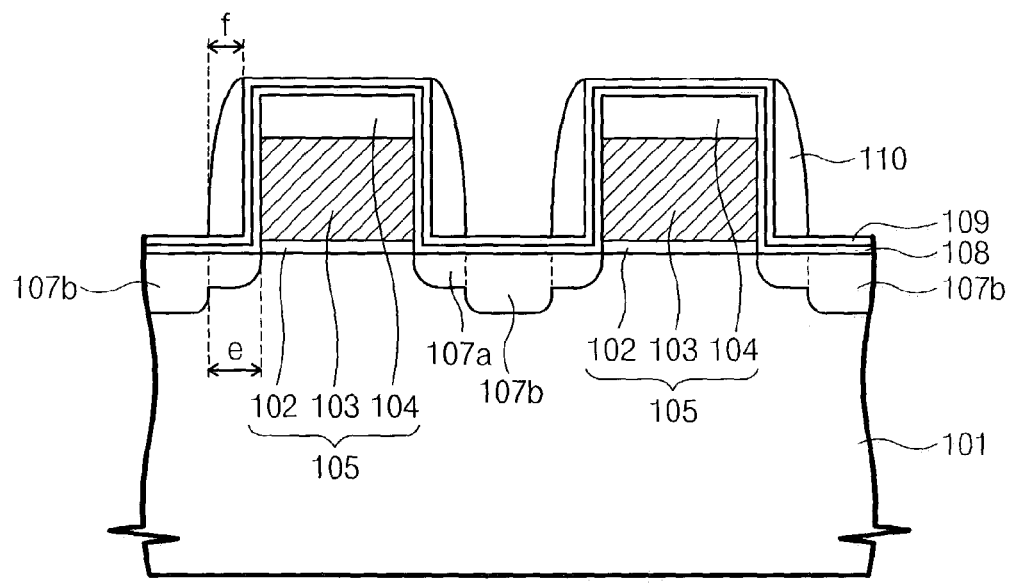
FIGS. 3–6 are cross-sectional views showing methods of forming a semiconductor device in accordance with embodiments of the present invention.

FIGS. 3–6 are cross-sectional views showing methods of forming a semiconductor device in accordance with some embodiments of the present invention. Referring to FIG. 3, a device isolation layer (not shown) is formed in a substrate 101 to define an active region. Gate patterns 105 are formed to cross over the active region in parallel. The gate patterns 105 includes a gate insulation layer 102, a gate electrode 103 and a hard mask layer 104 that are sequentially stacked. The gate insulation layer 102 may be formed of thermal oxide. The gate electrode 103 may be formed of dope polysilicon or polycide. The polycide may include a double-layered structure of doped poly silicon and metal silicide that are sequentially stacked. The hard mask layer 104 may be formed of silicon nitride.

Using the gate pattern 105 as a mask, impurity ions are implanted to form lightly doped impurity diffusion layers 107a in the active region at both sides of the gate pattern 105. In the embodiments illustrated in FIG. 3, conformal buffer insulation layer 108 and an etch shield layer 109 are sequentially formed on the surface of the substrate 101 with the lightly doped impurity diffusion layers 107a. Spacers 110 are formed on the etch shield layer 109 on sidewalls of the gate pattern 105. The etch shield layer 109 may be formed of insulation material having etch selectivity with respect to the spacers 110. If the spacers 110 are formed of silicon oxide, the etch shield layer 109 may be formed of silicon nitride. The buffer insulation layer 108 absorbs stress between the etch shield layer 109 and the substrate 101. The buffer insulation layer 108 may be formed of silicon oxide. In certain embodiments of the present invention, the buffer insulation layer 108 may be omitted.

Using the gate pattern 105 and the spacers 110 as a mask, impurity ions are implanted to form a heavily dope impurity diffusion layer 107b in the active region. The heavily doped impurity diffusion layer 107b has a higher dopant concentration than the lightly doped impurity diffusion layer 107a. The lightly and heavily doped impurity diffusion layers 107a and 107b may be formed to provide a lightly doped drain structure (LDD structure). The lightly and heavily doped impurity diffusion layers 107a and 107b correspond to source/drain regions. Each of the lightly doped impurity diffusion layers 107a has a width e that corresponds to and, in some embodiments, is identical to, the total thickness of the buffer insulation layer 108 and the etch shield layer 109 that are formed on sidewalls of the gate pattern 105, and a bottom width f of the spacer 110. As seen in FIG. 3, the bottom width f of the spacer is the distance that the spacer extends from the etch shield layer 109 on the sidewall of the gate pattern 105 proximate the substrate 101. In other words, inclusion of the buffer insulation layer 108 and the etch shield layer 109 may allow the bottom width f of the spacer 110 to be narrower than a bottom width of a conventional spacer.

Figure 4:
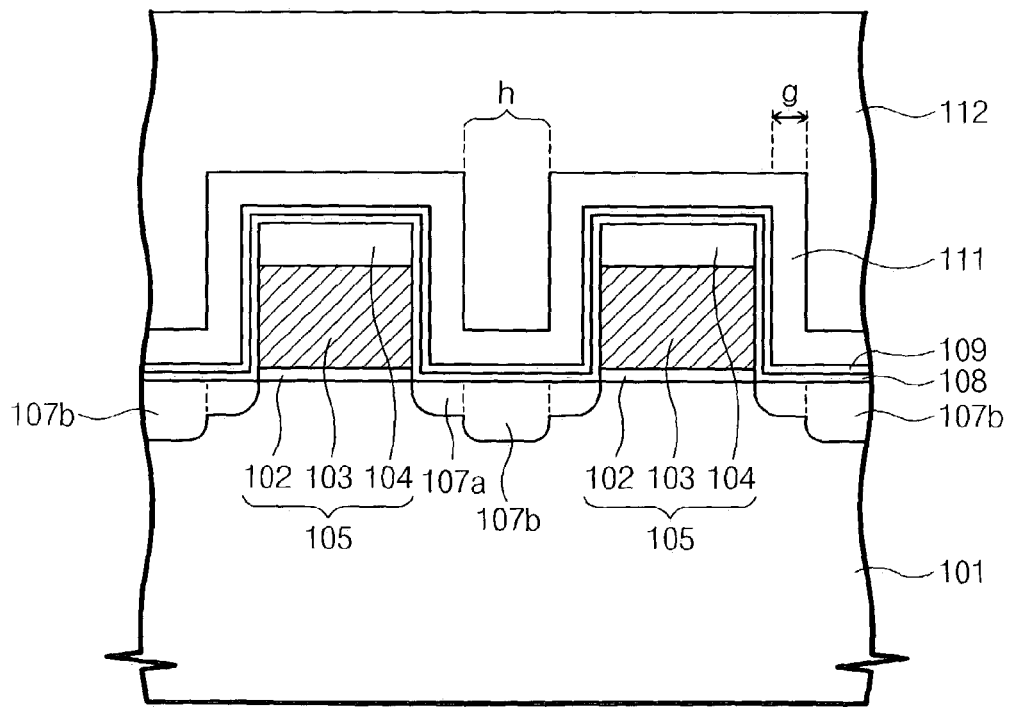

Referring to FIG. 4, the spacers 110 are removed by etching. In the case where the spacer 110 and the device isolation layer (not shown) are formed of silicon oxide, the device isolation layer is protected by the etch shield layer 109. A conformal etch stop layer 111 is formed on the etch shield layer 109 after removal of the spacers 110. The etch stop layer 111 is formed to a thickness g of at least the bottom width f of the spacer 110. The thickness g of the etch stop layer 111 may also be identical with the bottom width f of the spacer 110.

An interlayer insulation layer 112 is formed on the etch stop layer 111 to fill a gap region h between the gate patterns 105. The bottom width of the gap region h may be wider than that of the conventional gate patterns. That is, the thickness of the buffer insulation layer 108, the etch shield layer 109, and the etch stop layer 111 that are formed on a sidewall of the gate pattern may be the same as the width e of the lightly doped impurity diffusion layer 107a. Therefore, the bottom width of the gap region h may be wider than a gap with conventional techniques as described in FIG. 1 by, for example, double a thickness of the conventional etch stop layer 9. Thus, voids that may otherwise occur in the gap region between the conventional gate patterns may be suppressed.

The etch stop layer 111 is formed of insulation material having etch selectivity with respect to the interlayer insulation layer 112. Where the interlayer insulation layer 112 is formed of silicon oxide, the etch stop layer 111 may be formed of silicon nitride.

Figure 5:
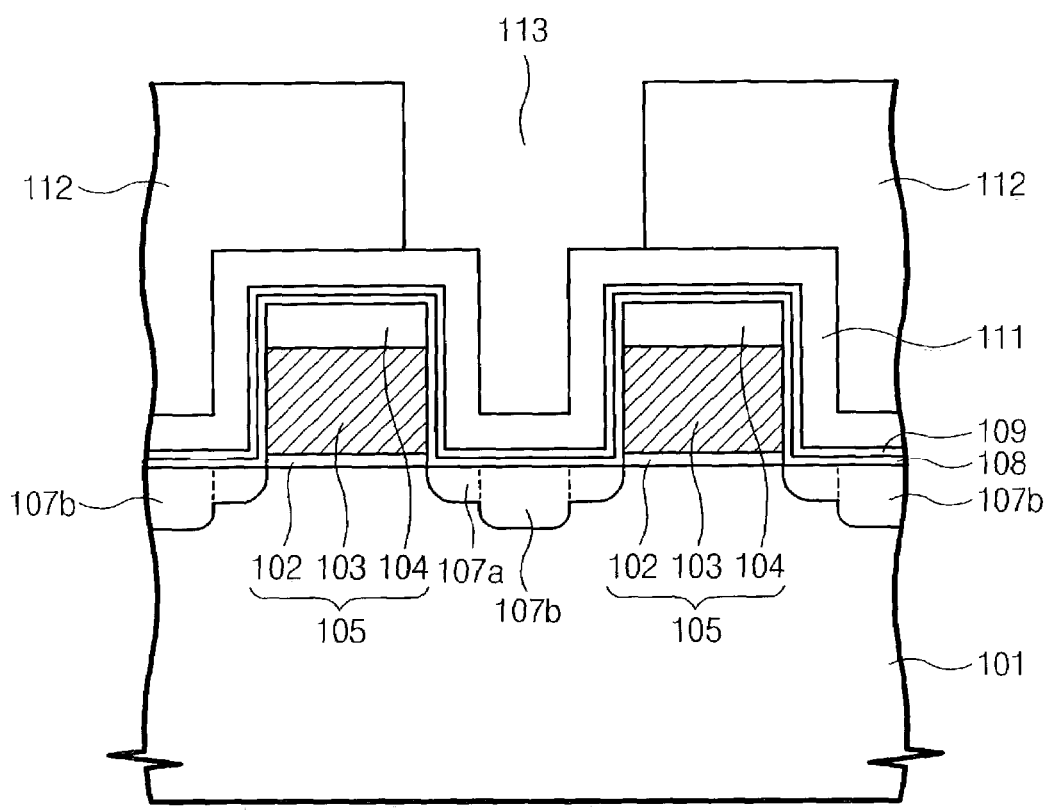
Figure 6:
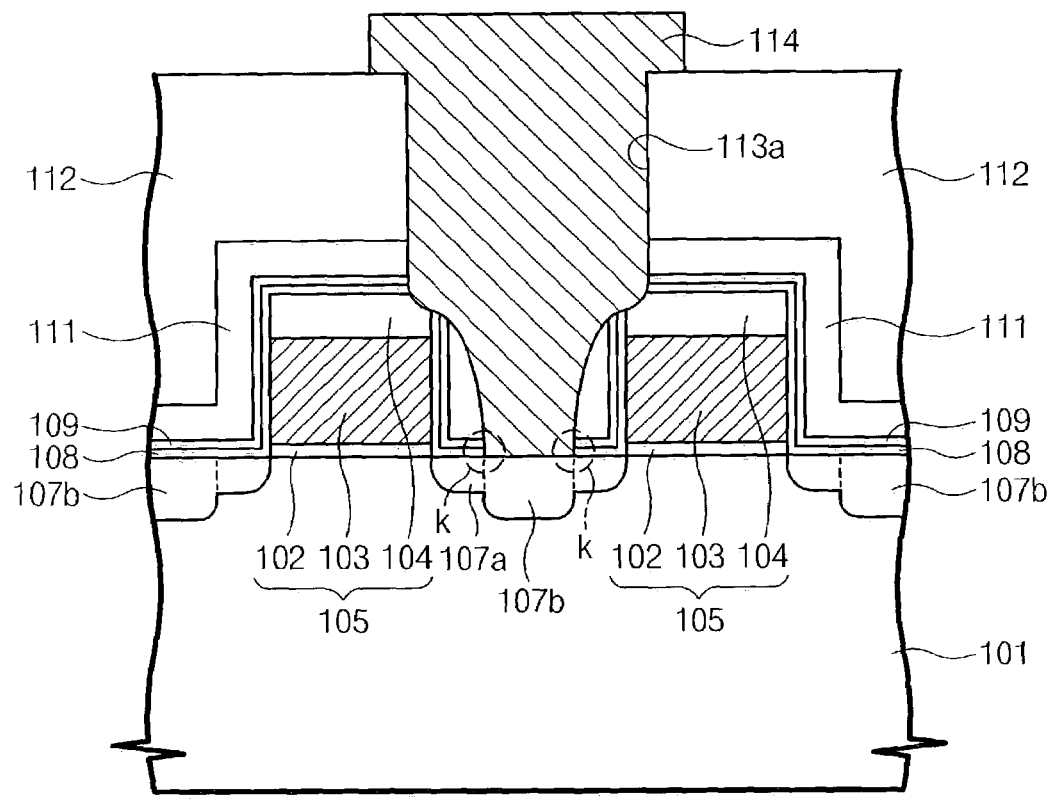

Referring to FIGS. 5 and 6, the interlayer insulation layer 112 is patterned to form a preliminary contact hole 113 that exposes at least a predetermined region of the etch stop layer 111 in the gap region h. The etch stop layer 111 exposed in the preliminary contact hole 113, the etch shield layer 109 and the buffer insulation layer 108 are successively etched using an anisotropic etch process, thereby forming a contact hole 113a that exposes the heavily doped impurity diffusion layer 107b. A conductive pattern 114 is formed to fill the contact hole 113a.

When the contact hole 113a is formed, the layers 108, 109 and 111 are conformal on the sidewalls of the gate pattern 105. As a result, a vertical thickness of the layers 108, 109 and 111 on the lightly doped impurity diffusion layer 107a is thicker than that of the heavily doped impurity diffusion layer 107b. That is, the vertical thickness of the layers 108, 109, and 111 is the summation of the height of a top of the gate pattern 105 from a top surface of the substrate 101 and the thicknesses of the layers 108, 109, and 111. Therefore, even though the layers 108, 109, and 111 on the heavily doped impurity diffusion layer 107b are over etched, edges k of the lightly doped impurity diffusion layer 107a are protected. As a result, the lightly doped impurity diffusion layers 107a may be protected, such that leakage current can be reduced or even prevented, that is caused by the exposure of the conventional lightly doped impurity diffusion layers as discussed above.

A method of forming a semiconductor device in accordance with further embodiments of the present invention is similar to that described above with reference to FIGS. 3–6 except for formation of another contact hole. That is, a butting contact hole is formed. The butting contact hole exposes source/drain regions and a gate electrode of a gate pattern neighboring the source/drain regions. The butting contact hole may be employed in a circuit that simultaneously applies input signals to the gate electrode and the source/drain regions of one transistor. In these embodiments, steps for forming the etch stop layer and the interlayer insulation layer may be carried out in the same way as described above with reference to FIGS. 1–4.

Figure 7:
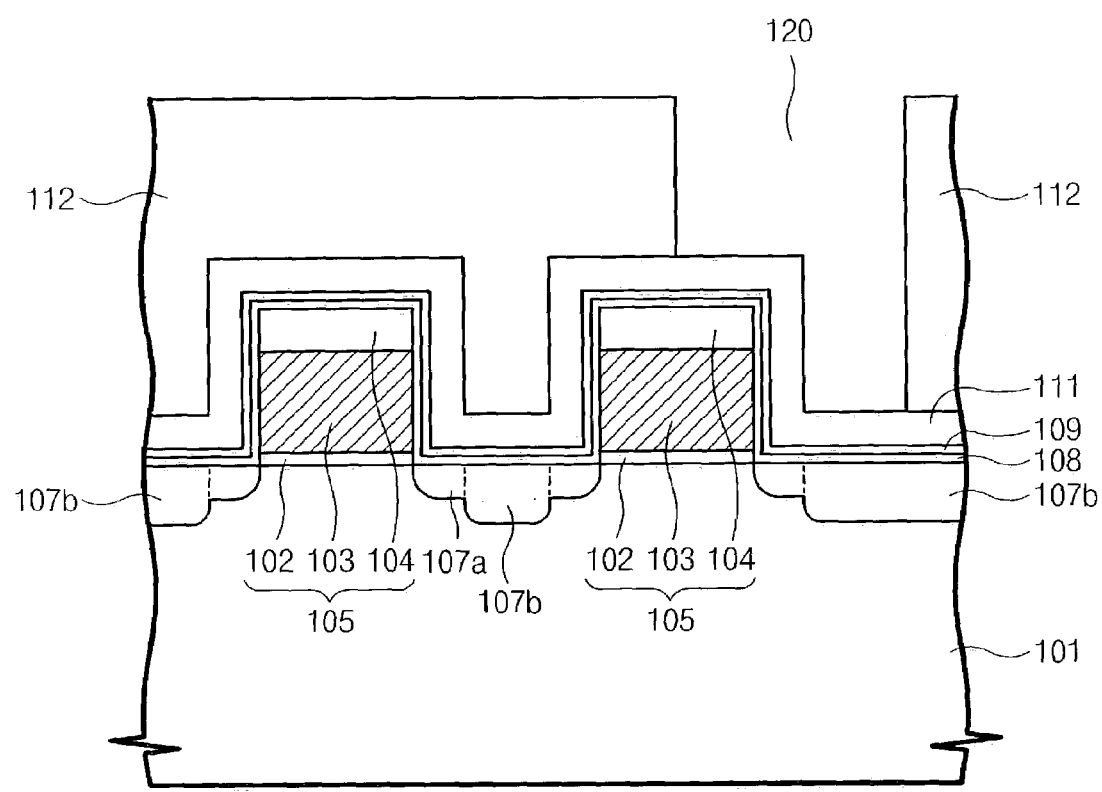
FIGS. 7 and 8 are cross-sectional views showing methods of forming a semiconductor device in accordance with additional embodiments of the present invention.
Figure 8:
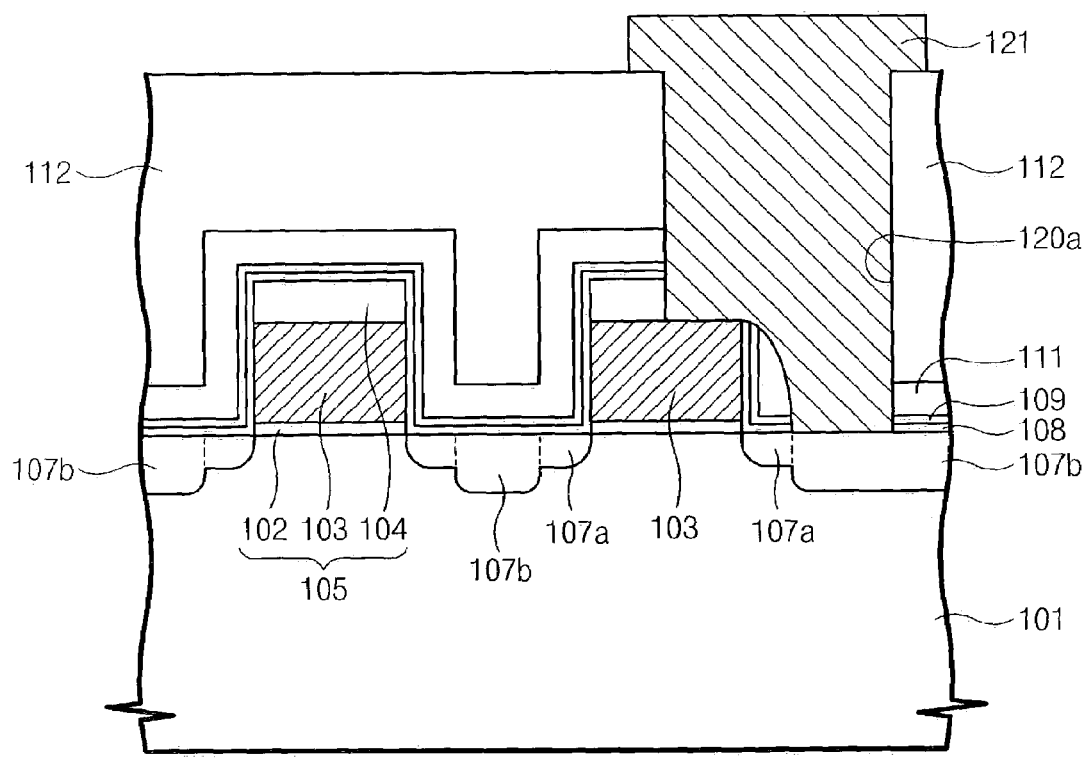

FIGS. 7 and 8 are cross-sectional views showing a fabrication of a semiconductor device in accordance with further embodiments of the present invention. Referring to FIGS. 7 and 8, an interlayer insulation layer 112 is patterned to form a preliminary butting contact hole 120 that exposes a predetermined region of an etch stop layer 111. The exposed etch stop layer 111 is located on a predetermined region of a top surface of the gate pattern 105 and on the lightly and heavily doped impurity diffusion layers 107a and 107b that neighbor the gate pattern 105.

The etch stop layer 111, the etch shield layer 109, the buffer insulation layer 108, and the hard mask layer 104 in the gate pattern 105 are anisotropically etched to form a butting contact hole 120a that exposes a portion of gate electrode 103 in the gate pattern 105 and the heavily doped impurity diffusion layer 107b. The layers 108, 109, and 111 are conformally formed on sidewalls of the gate pattern 105. Thus, the layers 108, 109, and 111 that are on the lightly doped impurity diffusion layers 107a have a vertical thickness that is thicker than the vertical thickness of the layers 104, 108, 109, and 111 that are on the gate electrode 103. Accordingly, while the etch process is performed to form the butting contact hole 120a, in spite of over etching, the lightly doped impurity diffusion layers 107a may be protected. Therefore, leakage current that is caused by the exposure of the conventional lightly doped impurity diffusion layers may be reduced or even prevented.

As is further illustrated in FIG. 8, a conductive pattern 121 may be formed to fill the butting contact hole 120a.

In still additional embodiments of the present invention, method of forming a semiconductor device including another butting contact hole are provided. The butting contact hole exposes source/drain regions of a first transistor and a gate electrode of a second transistor neighboring the first transistor. The butting contact hole may be utilized, for example, in a unit cell of SRAM memory devices. FIGS. 9–12 are cross-sectional views showing methods of forming the semiconductor substrate according to certain of these additional embodiments.

Figure 9:
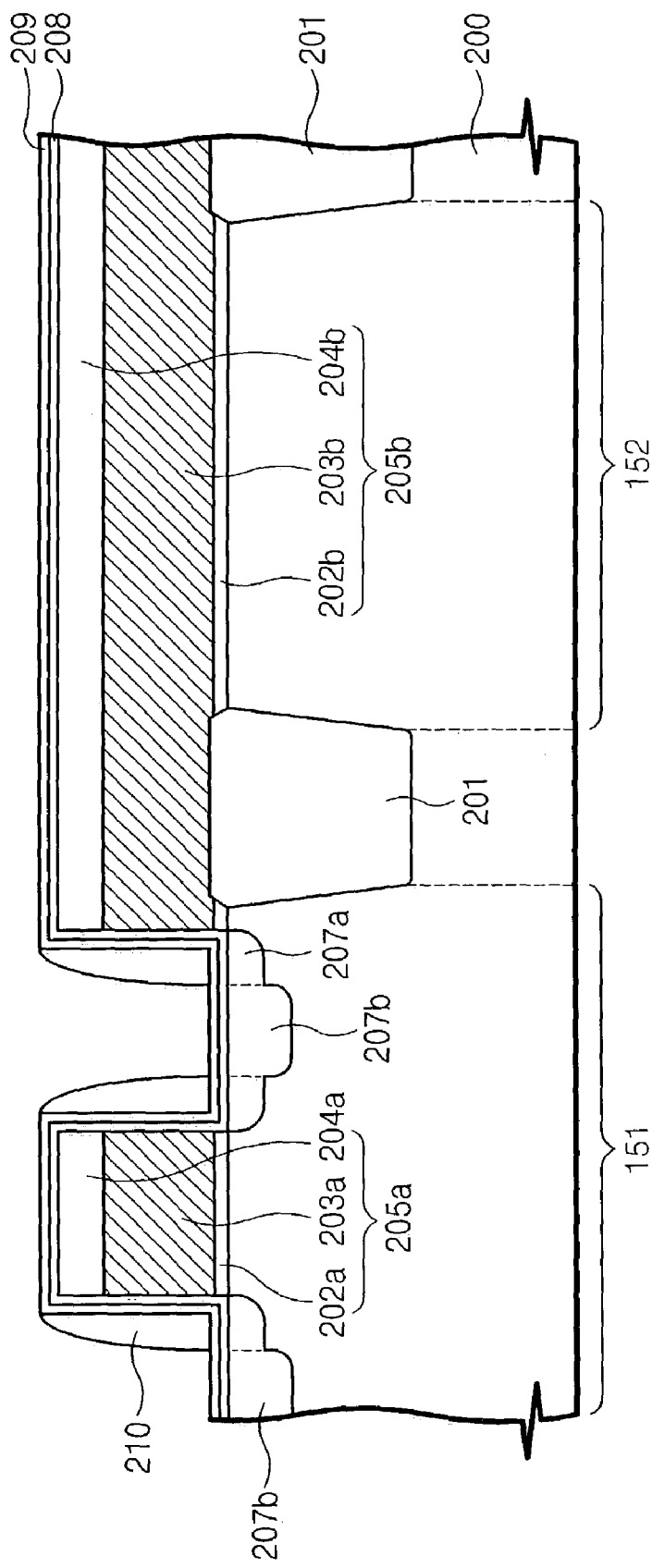
FIGS. 9–12 are cross-sectional views showing methods of forming a semiconductor device in accordance with still further embodiments of the present invention.

Referring to FIG. 9, a device isolation layer 201 is formed in a substrate 200 to define first and second active regions 151 and 152. The device isolation layer 210 may be formed with a trench device isolation layer. A first gate pattern 205a and a second gate pattern 205b are formed on the first and second active regions 151 and 152, respectively. The second gate pattern 205b is formed to cross over the device isolation layer 201 and to neighbor the first active region 151. The second gate pattern 205b may overlap a predetermined region of the first active region 151. In FIG. 9, the first gate pattern 205a is a cross-sectional view taken along a channel length and the second gate pattern 205b is a cross-sectional view of a channel width. However, the first and second gate patterns 205a and 205b may be located on different cross-sections, respectively. The first gate pattern 205a includes a first gate insulation layer 202a, a first gate electrode 203a and a first hard mask layer 204a that are sequentially stacked, and the second gate pattern 205b includes the second gate insulation layer 202b, the second gate electrode 203b, and the second hard mask layer 204b that are sequentially stacked. The first and second gate insulation layers 202a and 202b may be formed of thermal oxide. The first and second gate electrodes 203a and 203b may be formed of doped polysilicon or polycide. The polycide may include a double layered structure of doped polysilicon and metal suicide that are sequentially stacked. The first and second hard mask layers 204a and 204b may be formed of silicon nitride.

Using first and second gate patterns 205a and 205b as a mask, impurity ions are implanted to form first lightly doped impurity diffusion layers 207a and second lightly doped impurity diffusion layers (not shown) in the first and second active regions 151 and 152, respectively. In the embodiments illustrated in FIG. 9, a buffer insulation layer 208 and an etch shield layer 209 are formed conformally and sequentially on a surface of the substrate 200 that includes the first lightly doped impurity diffusion layers 207a and the second lightly doped impurity diffusion layers (not shown). Spacers 210 are formed on the etch shield layer 209, wherein the spacers 210 are on opposite sidewalls of the first and second gate patterns 205a and 205b, respectively. The etch shield layer 209 may be formed of insulation material having etch selectivity with respect to the spacers 210. Where the spacers 210 are formed of silicon oxide, the etch shield layer 209 may be formed of silicon nitride. The buffer insulation layer 208 absorbs stress of the etch shield layer and semiconductor substrate 200. The buffer insulation layer 208 may be formed of silicon oxide. In certain embodiments, the buffer insulation layer 208 may be omitted.

Using the first and second gate patterns 205a and 205b and the spacers 210 as a mask, impurity ions are implanted to form a first heavily doped impurity diffusion layer 207b and a second heavily doped impurity diffusion layer (not shown) in the first and second active regions 151 and 152, respectively. The first heavily doped impurity diffusion layer 207b has a higher impurity concentration than the first lightly doped impurity diffusion layer 207a. The first lightly and heavily doped impurity diffusion layers 207a and 207b may be provided as a lightly doped drain structure (LDD structure). The second lightly and heavily doped impurity diffusion layers (not shown) are also formed with the LDD structure.

Alternatively, the first lightly and heavily doped impurity diffusion layers 207a and 207b, and the second lightly and heavily doped impurity diffusion layers (not shown) may be formed in sequential order. That is, the second lightly and heavily doped impurity diffusion layers (not shown) may formed with impurities different from those the lightly and heavily doped impurity diffusion layers 207a and 207b. For example, the first lightly and heavily doped impurity diffusion layers 207a and 207b may be formed with n-type impurities and the second lightly and heavily doped impurity diffusion layers (not shown) may be formed with p-type impurities. The first lightly and heavily doped impurity diffusion layers 207a and 207b could also be formed with p-type impurities and the second lightly and heavily doped impurity diffusion layers (not shown) could be formed with n-type impurities.

Figure 10:
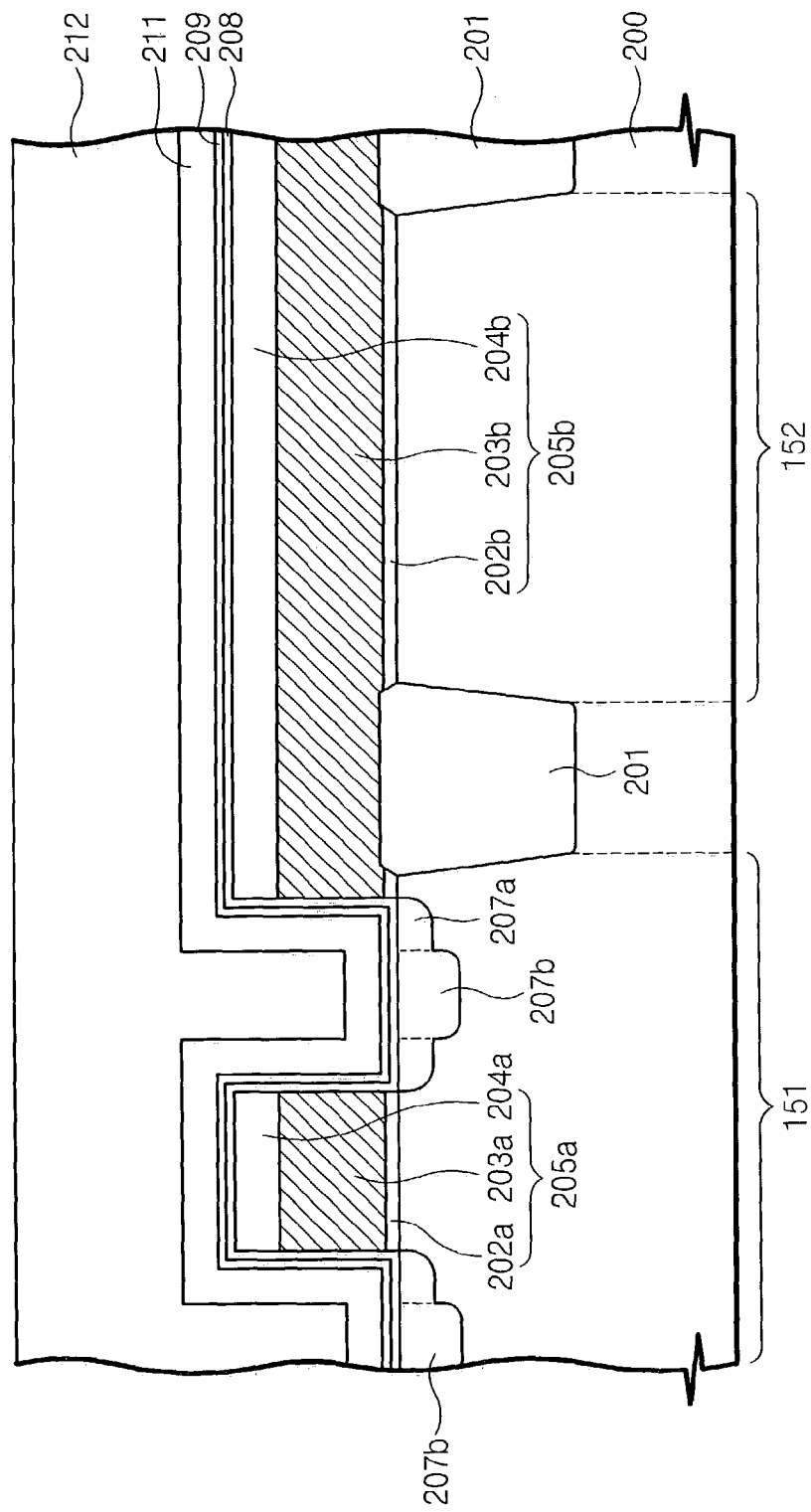

Referring to FIG. 10, the spacers B are removed by etching. A conformal etch stop layer 211 is formed on the etch shield layer 209 without the spacers 210. The thickness of the etch stop layer 211 is formed to at least the bottom width of the spacer 210. In certain embodiments, the thickness of the etch stop layer may be identical with the bottom width of the spacer 210.

An interlayer insulation layer 212 is formed on the etch stop layer 211. The etch stop layer 211 is formed of insulation layer having etch selectivity with respect to the interlayer insulation layer 212. Where the interlayer insulation layer 212 is formed of silicon oxide, the etch stop layer 211 may be formed of silicon nitride.

Figure 11:
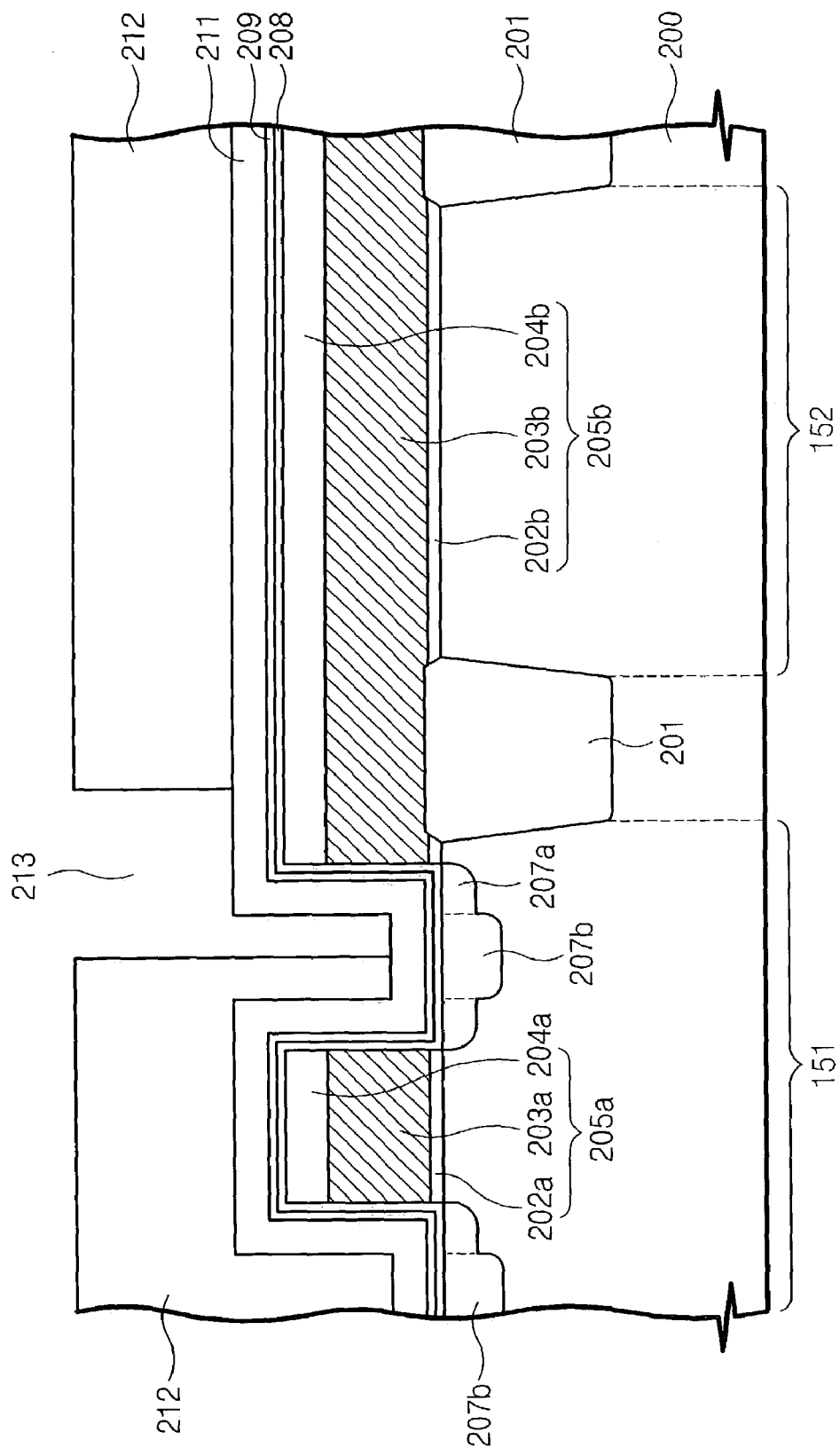
Figure 12:
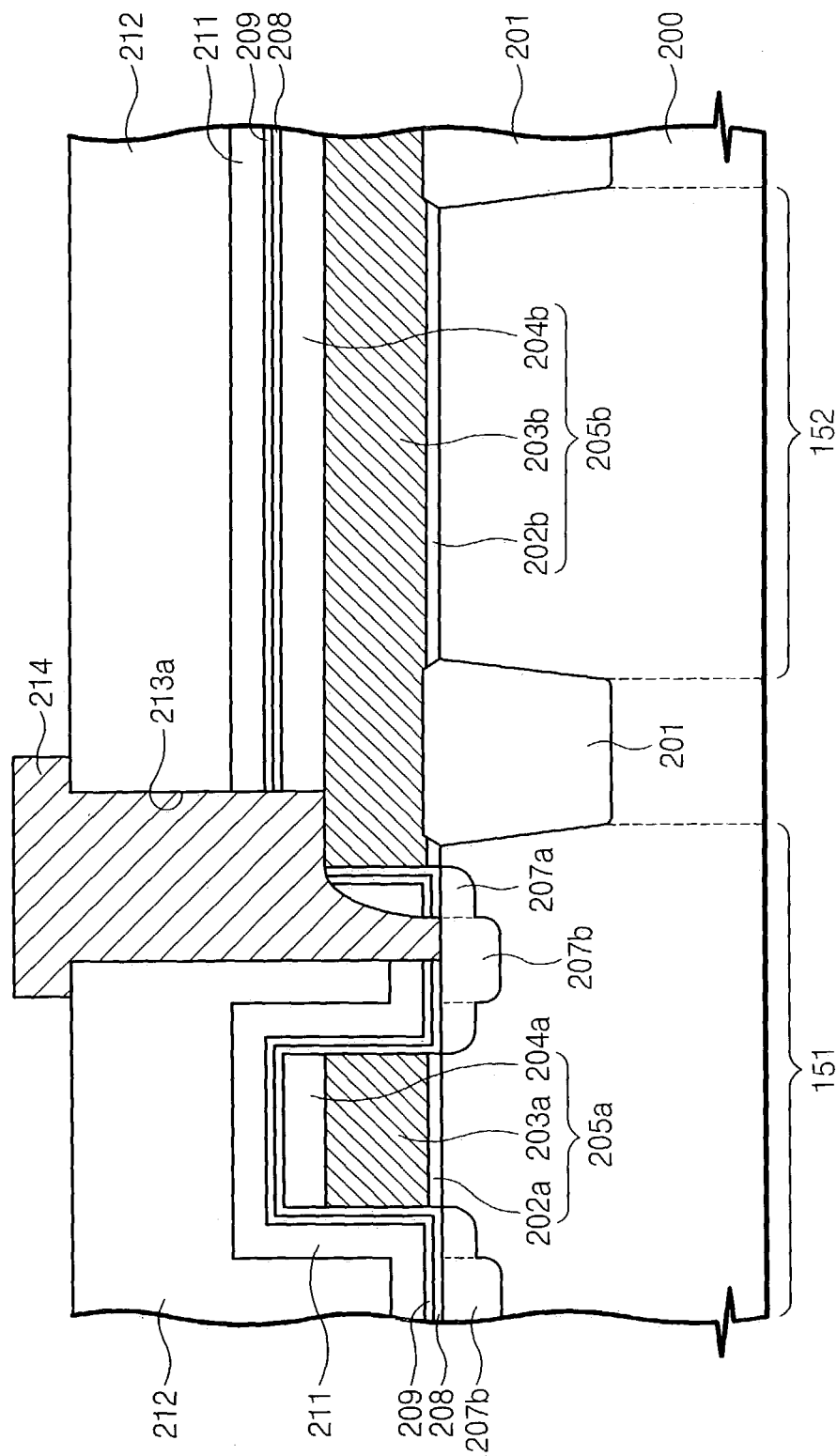

Referring to FIGS. 11 and 12, the interlayer insulation layer 212 is patterned to form a preliminary butting contact hole 213 that exposes a predetermined region of the etch stop layer 211. The exposed etch stop layer 211 lies on the first heavily and lightly doped impurity diffusion layers 207a and 207b and on a predetermined region of a top surface of the second gate pattern 205b neighboring the first active region 151.

The etch stop layer 211 and the etch shield layer 209, the buffer insulation layer 208 and the second hard mask layer 204b, which are exposed in the preliminary butting contact hole 213, are anisotropically and successively etched to form a butting contact hole 213a that exposes the first heavily doped impurity diffusion layer 207b and a portion of the second gate electrode 203b. A conductive pattern 214 is also formed to fill the butting contact hole 213a.

The layers 208, 209, and 211 are conformally formed on the sidewalls of the gate pattern 205a. As a result, a vertical thickness of the layers 208, 209, and 211 lying on the first lightly doped impurity diffusion layers 207a is thicker than that of the layers 204b, 208, 209, and 211 lying on the second gate electrode 203b. Accordingly, while the etch process is performed to form the butting contact hole 213a, in spite of over etching, the lightly doped impurity diffusion layers 207a can be protected. Therefore, leakage current that is caused by the exposure of the conventional lightly doped impurity diffusion layers may be reduced or prevented.

According to the present invention, after forming the heavily doped impurity diffusion layer, a spacer is removed. Then an etch stop layer is formed to at least a bottom width of the spacer. Thus, a bottom width of a gap region may be wider than in the conventional techniques described above. As a result, voids that occur in the gap region between the conventional gate patterns may be suppressed.

In addition, an etch stop layer is conformally formed on the lightly doped impurity diffusion layers, such that the exposure of the lightly doped impurity diffusion layers can be reduced or prevented. Therefore, leakage current that is caused by the exposed conventional lightly doped impurity diffusion layers may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a semiconductor device comprising:
   forming a gate pattern that includes a gate electrode on a substrate;
   forming lightly doped impurity diffusion layers in the substrate at both sides of the gate pattern;
   forming spacers on sidewalls of the gate pattern, the spacers having a bottom width;
   implanting impurity ions using the gate pattern and the spacer as a mask to form a heavily doped impurity diffusion layer in the substrate;
   removing the spacers; and
   forming a conformal etch stop layer on the gate pattern and the substrate after removing the spacers, wherein the etch stop layer is formed to a thickness of at least the bottom width of the spacers.

2. The method of claim 1, further comprising:
   forming a conformal etch shield layer on the gate pattern and the substrate, wherein the etch shield layer is formed of insulation material having etch selectivity with respect to the spacers; and
   wherein the step of forming spacers comprises forming spacers on the etch shield layer on opposite sidewalls of the gate pattern.

3. The method of claim 2, further forming a conformal buffer insulation layer the gate pattern and the substrate; and
   wherein forming a conformal etch shield layer further comprises forming a conformal etch shield layer on the conformal buffer insulation layer.

4. The method of claim 2, wherein the spacers comprise silicon oxide and the etch shield layer comprise silicon nitride.

5. The method of claim 1, wherein the heavily doped impurity diffusion layer has a higher impurity concentration than the lightly doped impurity diffusion layer; and
   wherein the lightly and heavily doped impurity diffusion layers are formed to provide a lightly doped drain structure.

6. The method of claim 1, wherein the etch stop layer is formed to a thickness substantially identical to the bottom width of the spacer.

7. The method of claim 1, further comprising:
   forming an interlayer insulation layer on the etch stop layer;
   successively patterning the interlayer insulation layer and the etch stop layer to form a contact hole that exposes at least the heavily doped impurity diffusion layer; and
   forming a conductive pattern that fills the contact hole.

8. The method of claim 7, wherein the etch stop layer is formed of insulation material having etch selectivity with respect to the interlayer insulation layer.

9. The method of claim 8, wherein the interlayer insulation layer comprises silicon oxide, and the etch stop layer comprises silicon nitride.

10. The method of claim 7, wherein successively patterning the interlayer insulation layer and the etch stop layer, comprises:
    patterning the interlayer insulation layer to expose at least the etch stop layer on the heavily doped impurity diffusion layer; and
    anisotropically etching the exposed etch stop layer to form a contact hole that exposes at least the heavily doped impurity diffusion layer.

11. The method of claim 10, wherein the contact hole further exposes a portion of the gate electrode in the gate pattern.

12. A method of forming a semiconductor device comprising:
    forming a device isolation layer in a substrate to define first and second active regions;
    forming a first gate pattern on the first active region and a second gate pattern on the second active region, wherein the first gate pattern comprises a first gate insulation layer, a first gate electrode, and a first hard mask layer that are stacked, and the second gate pattern comprises a second gate insulation layer, a second gate electrode, and a second hard mask layer that are stacked;
    forming a lightly doped impurity diffusion layer in the first active region at both sides of the first gate pattern;
    forming spacers on sidewalls of the first and second gate patterns, the sidewall spacers having a bottom width;
    forming a heavily doped impurity diffusion layer in the first active region using the first gate pattern and the spacers on the sidewalls of the first gate pattern as a mask;
    removing the spacers; and
    forming a conformal etch stop layer on the first and second gate patterns and the substrate after removing the spacers,
    wherein the second gate pattern is formed to cross over the device isolation layer and to reach the first active region, and
    wherein the etch stop layer is formed to a thickness of at least the bottom width of the sidewall spacers.

13. The method of claim 12, further comprising forming a conformal etch shield layer on the first and second gate patterns and the substrate, wherein the etch shield layer is formed of insulation material having etch selectivity with respect to the spacers; and
    wherein forming spacers comprises forming spacers on the etch shield layer on opposite sidewalls of the first and second gate patterns.

14. The method of claim 13, further comprising forming a conformal buffer insulation layer on the first and second gate patterns and the substrate; and wherein forming a conformal etch shield layer comprises forming a conformal etch shield layer on the buffer insulation layer.

15. The method of claim 13, wherein the spacers comprise silicon oxide, and the etch shield layer comprises silicon nitride.

16. The method of claim 12, wherein the heavily doped impurity diffusion layer has a higher impurity concentration than the lightly doped impurity diffusion layer, and wherein the lightly and heavily doped impurity diffusion layers are formed to provide a lightly doped drain structure.

17. The method of claim 12, wherein the etch stop layer is formed to a thickness substantially identical to the bottom width of the spacers.

18. The method of claim 12, further comprising:

forming an interlayer insulation layer on the etch stop layer;

successively patterning the interlayer insulation layer and the etch stop layer to form a contact hole that exposes the heavily doped impurity diffusion layer and a portion of the second gate electrode; and forming a conductive pattern to fill the contact hole.

19. The method of claim 18, wherein the etch stop layer comprises an insulation material having etch selectivity with respect to the interlayer insulation layer.

20. The method of claim 19, wherein the interlayer insulation layer comprises silicon oxide, and the etch stop layer comprises silicon nitride.

21. The method of claim 18, wherein successively patterning the interlayer insulation layer and the etch stop layer comprises:

patterning the interlayer insulation layer to expose a portion of the etch stop layer that is located on the heavily and lightly doped impurity diffusion layers and a predetermined region of a top surface of the second gate pattern; and successively etching the exposed etch stop layer and the second hard mask layer to form a contact hole that exposes the heavily doped impurity diffusion layer and a portion of the second gate electrode.

* * * * *

UNITED STATES PATENT AND TRADEMARK OFFICE
CERTIFICATE OF CORRECTION

PATENT NO. : 7,202,180 B2  Page 1 of 1
APPLICATION NO. : 10/625452
DATED : April 10, 2007
INVENTOR(S) : Koh et al.

It is certified that error appears in the above-identified patent and that said Letters Patent is hereby corrected as shown below:

On The Title Page:

Item (75): correct Inventors name to read -- Byung-Joon Hwang --

Signed and Sealed this

Tenth Day of July, 2007

JON W. DUDAS
*Director of the United States Patent and Trademark Office*